United States Patent
Van Der Linden et al.

(10) Patent No.: US 9,769,918 B2
(45) Date of Patent: Sep. 19, 2017

(54) FLEXIBLE LAMINATE

(71) Applicant: ALT Technologies B.V., Utrecht (NL)

(72) Inventors: Ingmar Cees Johannes Van Der Linden, Utrecht (NL); Jelmer Douwe Sminia, Utrecht (NL)

(73) Assignee: ALT TECHNOLOGIES B.V., Utrecht (NL)

(*) Notice: Subject to any disclaimer, the term of this patent is extended or adjusted under 35 U.S.C. 154(b) by 143 days.

(21) Appl. No.: 14/317,747

(22) Filed: Jun. 27, 2014

(65) Prior Publication Data

US 2015/0061345 A1 Mar. 5, 2015

(30) Foreign Application Priority Data

Sep. 5, 2013 (EP) .................................... 13183123

(51) Int. Cl.
*H05B 3/34* (2006.01)
*H05K 1/02* (2006.01)
(Continued)

(52) U.S. Cl.
CPC ........... *H05K 1/028* (2013.01); *B60N 2/5685* (2013.01); *B60N 3/04* (2013.01); *H05B 3/36* (2013.01);
(Continued)

(58) Field of Classification Search
CPC .......... H05K 1/028; H05K 13/06; H05K 1/09; H05K 1/0353
(Continued)

(56) References Cited

U.S. PATENT DOCUMENTS 4,158,078 A 6/1979 Egger et al.
7,439,474 B2 * 10/2008 Huang .................... A61F 7/007
219/211
(Continued)

FOREIGN PATENT DOCUMENTS

| EP | 0 175 662 A1 | 3/1986 |
| EP | 2 062 771 A1 | 5/2009 |
| WO | 91/16841 A1 | 11/1991 |

OTHER PUBLICATIONS

EP Search Report, dated Jan. 29, 2014, from corresponding EP application.

*Primary Examiner* — Phuong Nguyen
(74) *Attorney, Agent, or Firm* — NLO N.V.; Catherine A. Shultz; Minerva Rivero

(57) ABSTRACT

A flexible laminate (1) includes an electrically non-conductive substrate (2) with a substantially planar configuration, an electrically conductive element (3) on a surface of the electrically non-conductive substrate, and a layer (4) on a surface of the electrically non-conductive substrate (2). The electrically non-conductive substrate (2), the electrically conductive element (3) and the layer (4) are coaxially punctured forming a punctured region (6). They are connected to each other through a mechanical connection element (5) which extends through the electrically non-conductive substrate (2), the electrically conductive element (3) and the layer (4) at the punctured region (6). The cross-sectional area of the electrically conductive element (3) at the location of the punctured region (6) is larger than the cross-sectional area of the electrically conductive element (3) outside the punctured region (6).

20 Claims, 3 Drawing Sheets

(51) Int. Cl.
  *H05K 13/06* (2006.01)
  *B60N 2/56* (2006.01)
  *H05B 3/36* (2006.01)
  *H05K 1/03* (2006.01)
  *H05K 1/09* (2006.01)
  *B60N 3/04* (2006.01)

(52) U.S. Cl.
  CPC ............. *H05K 1/0353* (2013.01); *H05K 1/09* (2013.01); *H05K 13/06* (2013.01); *Y10T 29/49162* (2015.01)

(58) Field of Classification Search
  USPC ....... 219/530, 549, 527, 528, 529, 548, 552, 219/553, 211, 212, 217, 203, 213, 214, 219/219
  See application file for complete search history.

(56) References Cited

U.S. PATENT DOCUMENTS

| | | | |
|---|---|---|---|
| 2005/0173414 A1* | 8/2005 | Ishii | H01C 1/01 219/549 |
| 2008/0290086 A1* | 11/2008 | Caterina | F24D 13/024 219/530 |
| 2009/0051196 A1* | 2/2009 | Ishii | H05B 3/146 297/180.12 |
| 2009/0321415 A1* | 12/2009 | Zhang | H05B 1/0294 219/528 |
| 2010/0213189 A1* | 8/2010 | Keite-Telgenbuescher | B60R 1/0602 219/548 |

* cited by examiner

FLEXIBLE LAMINATE

TECHNICAL FIELD

The present invention relates to a flexible laminate, comprising an electrically non-conductive substrate with a substantially planar configuration, an electrically conductive element on a surface of the electrically non-conductive substrate, and a layer on a surface of the electrically non-conductive substrate, wherein the electrically conductive element is elongate and has an external cross-sectional contour delimiting a cross-sectional area of the electrically conductive element.

BACKGROUND ART

Such flexible laminates may have elongate electrically conductive in the form of a heating wire which is positioned on the substrate in a meandering shape so as to heat the laminate over full surface thereof. The wire is connected to the substrate by means of a sewing operation, wherein the sewing thread is slung around the wire without penetrating or otherwise damaging the wire. Usually, such laminate is bonded to further layers, such as a car seat layer, by means of an adhesive. Such process of assembling the flexible laminate, as well as assembling it with other components is time-consuming and is therefore relatively costly.

DISCLOSURE OF INVENTION

It is therefore an object of the present invention to at least overcome one of the above mentioned disadvantages of the prior art. It is also an object of the present invention is to provide a flexible laminate wherein the electrically conductive element is securely stabilized.

It is also an object of the present invention to provide a flexible laminate having a complete adaptability to different forms and locations.

It is even a further object of the present invention to provide a flexible laminate that can provide an optimal heat distribution, to e.g. with respect to even or uneven surfaces.

It is furthermore an objective of the present invention to provide a method of manufacturing the flexible laminate in which the connection between a substrate and another layer can easily be established.

These objects are achieved in that the electrically non-conductive substrate, the electrically conductive element and the layer are coaxially punctured forming a punctured region, in that the electrically non-conductive substrate, the electrically conductive element and the layer are connected to each other through a mechanical connection means which extends through the electrically non-conductive substrate, the electrically conductive element and the layer at said punctured region, and in that the cross-sectional area of the electrically conductive element at the location of the punctured region is larger than the cross-sectional area of the electrically conductive element outside the punctured region.

By having the electrically non-conductive substrate and the adjacent layer fixedly connected to each other through a mechanical connection means, the flexible laminate can perfectly fit in different unique applications, providing a steady flexible laminate that can withstand large stresses without any of the elements of the laminate being moved or misplaced. Moreover, the laminate can be securely connected to any even or uneven part, e.g. flat or curved, and at the same time, provide e.g. a uniform heat distribution to said even or uneven part. Furthermore, the laminate provided has an optimal tensile impact strength, exhibiting a good ductile behavior under large loads or stresses. It should be noted that by connecting the substrate and the adjacent layer in this manner, a relatively low cost flexible laminate is provided.

According to an embodiment of the invention, at the location of the punctured region, the magnitude of the cross-sectional area of the punctured region, as covered by the electrically conductive element material, is substantially equal to the magnitude of the cross-sectional area, as covered by the electrically conductive element material, of the electrically conductive element at the location outside the punctured region.

Advantageously, this provides a secure connection between the elements of the laminate, while the electrically conductive element does not create hotspots at the location of the puncture. Such hotspot might lead to damage of a flexible heating laminate, which in the end will result in an in operational state of the laminate. In other words, the cross-sectional surface area of the electrically conductive element is punctured without creating a hotspot and without affecting e.g. the heat-generation capability of a flexible heating laminate.

According to the invention, the electrically conductive element has a thickness which is uniform over the punctured region as well as over the non-punctured region, and has a width at the punctured region which is larger than the width outside the punctured region.

In this manner, minimum space is required for installation of e.g. a flexible heating laminate, while a good heat distribution over a whole heating surface is provided. Moreover, the heat thermal distribution is guaranteed because the surface of the heating element at the punctured region is wide enough to avoid the formation of hotspots in said punctured region.

According to an embodiment, the electrically conductive element comprises copper. Moreover, the electrically conductive element can comprise a metal strip, preferably a copper strip. Furthermore, the electrically conductive element comprises a metal print, preferable a copper print, said metal print being arranged on the substrate.

Advantageously, this allows the possibility to have very small conductors with ultra-high wiring density. Moreover, the laminate can bend and flex as much as it may be required, depending on the specific application. Furthermore, the electrical conductivity and the compatibility with other parts are intensified, since copper, as well as copper alloys provide with a high strength as well as high electrical conductivity, compared with conventional electrically conductive element.

In a preferred embodiment of the invention, the mechanical connection means is a stitch or a sequence of stitches.

In this manner, a simple and strong mechanical connection is provided between the electrical non-conductive substrate and the layer, allowing precise positioning of the electrical non-conductive substrate with respect to the layer and vice versa. The stitch or the sequence of stitches can guarantee the heating properties of the flexible heating laminate, while preventing any possible disconnection resulting from excessive heat.

According to an embodiment, the electrically conductive element has the form of a circuit. Advantageously, the electrically conductive element can be adapted to specific circumstances of a given application case, in order to optimize different heat generation requirements. An optimal and complex design of the form of the electrically conductive element can be provided in order to have customized heat production areas.

According to the invention, the circuit comprises at least one electrical supply line or power line. It should be noted that the circuit comprises at least two electrodes for supplying current, e.g. configured as planar strips of an electrically conductive material, connected to an electrical heating element.

Accordingly, the power line and the electrodes are directly connected to the electrodes for supplying current, wherein said electrodes can be applied directly onto one of the surfaces of the electrically non-conductive substrate, being in this way, able to easy connect and disconnect from the flexible heating laminate.

It should be noted that the mechanical connection means may also protrude through the electrical supply line, the electrodes or any other part of the laminate as to secured them against displacement.

In an embodiment of the present invention, the electrically conductive element comprises several punctured areas at a distance from each other. Advantageously, a secure connection between the electrically non-conductive substrate and the layer is provided. The chances that the electrically non-conductive substrate is displaced with respect to the layer due to the weight or action on the assembly are minimized. This ensures non-slippage of the parts of the laminate.

In a preferred embodiment of the invention, a heat-resistant adhesive cover layer is provided on one of the electrically conductive element. The heat-resistant adhesive cover layer relieves the stresses applied to the laminate and also reduces possible cracking of the electrically conductive element. Moreover, this additional cover layer reduces structural deterioration of the laminate. Furthermore, the cover layer minimizes the moisture penetration that can create corrosion of the electrically conductive element and/or other parts of the laminate. Thus, the operational life of the flexible heating laminate is increased.

According to the invention, the electrically non-conductive substrate is made of a thermoplastic material which preferably comprises Polyethylene terephthalate (PET). Advantageously, the flexible heating laminate provided can have a longer operational life in environments with high shock and vibrations, as the PET has high mechanical strength which allows the electrically non-conductive substrate to absorb energy and plastically deform without fracturing.

In a preferred embodiment of the invention, the electrically conductive element has a meandering shape, a series of stitches crossing said meanderingly shaped electrically conductive element and said electrically conductive element being punctured at the regions thereof which cross the series of stitches. In this manner, a higher density per unit of surface area of the electrically conductive element is provided on one of the surfaces of the electrically non-conductive substrate, as to supply a desired heat surface and optimize the heat generation and distribution, depending on the specific application of the laminate.

It should be noted that the laminate could also comprise sensors, e.g. temperature sensors for regulation as well as for limitation of the temperature, and other connectors which can easily be installed onto one of the surfaces of the laminate or connected directly to the laminate. Further sensors include a detection sensor for detecting the presence of a person on e.g. a car seat.

Moreover, the invention also relates to a car seat comprising a seat part and a back part, and a flexible laminate according to any of the preceding claims, said flexible laminate being accommodated in the seat part and/or the back part.

Additionally, the invention relates to an electrically conductive device for use in the flexible laminate, the device comprising an electrically non-conductive substrate and an electrically conductive element, said electrically conductive element comprising at least one nominal puncture region or region to be punctured, wherein at said at least one nominal puncture region the magnitude of the cross-sectional area as covered by the electrically conductive element material is larger than the magnitude of the cross-sectional area of the electrically conductive element material at a neighboring region. Moreover, the length of the nominal puncture region is of the same order of magnitude as the width and/or height thereof.

In this manner, the connection points of the electrically conductive device can be easily identified, allowing this and easy and rapid installation of the electrically conductive device.

Furthermore, the invention also relates to a method for manufacturing a flexible laminate, comprising the steps of:
a) providing an electrically non-conductive substrate of flexible material;
b) printing onto one surface of the electrically non-conductive substrate an electrically conductive element in the form of a circuit,
c) providing a layer onto one of the surfaces of the electrically non-conductive substrate,
d) coaxially puncturing the electrically non-conductive substrate, the electrically conductive element and the layer so as to form at a punctured region, and
e) providing a mechanical connection means through the punctured region.

As a result, the flexible laminate has the adaptability and flexibility required in a car application. The method allows a minimum printing amount of conductive copper material onto one of the surfaces of the substrate, providing a low consumption of energy laminate.

In a preferred example of the manufacturing method of the flexible laminate, when after carrying out step a), the electrically conductive element is printed with at least a relatively large cross-sectional surface area region to be punctured, and after carrying out step c), the electrically conductive element is punctured at the relatively large cross-sectional surface region.

The manufacturing method of the flexible laminate according to the present invention has an advantageous effect of achieving production of the laminate without largely changing a conventional method, including one or more of the avoidance of high temperature steps for applying the electrically conductive element onto the substrate, while using relatively low cost application techniques e.g. printing for providing an improved flexible laminate.

As mentioned before, the flexible laminate may be carried out for several different applications. It may take the form of a heater, in which case the flexible laminate has an electrically conductive element which comprises an electric resistance heater. Alternatively, the flexible laminate may be applied for supplying current, in which case the electrically conductive element comprises electric feed lines. Also, such embodiment may comprise sensors, such as a heat sensor, a seat occupancy sensor and the like.

Reference is made to EP-A-2191060 which discloses a flexible heater with an electrically conductive coating on a flexible non-conductive carrier, and at least two electrodes for supplying electric current disposed at opposing edges of the coating. The electrodes are accommodated each within a respective seam at the edge of the carrier. These seams are obtained by stitching, such that each electrode is in contact with the electrically conductive coating. The electrodes are punctured at the location of the stitches. The carrier can be positioned on component of a car, such as a car seat, as to heat said component.

This prior art laminate lacks an elongate electrically conductive element, e.g. on the form of a wire or print. Neither does this prior art address the problem of puncturing a narrow elongate conductive element such as a print when carrying out a stitching operation. The electrodes are indeed stitched, however the size thereof makes that the punctures thus obtained do not influence the electric current.

BRIEF DESCRIPTION OF DRAWINGS

Other aspects, features and details of the present invention will be readily understood by reference to the following detailed description of preferred embodiments of a flexible heating laminate, taken in conjunction with the drawings.

BEST MODE FOR CARRYING OUT THE INVENTION

Figure 1:
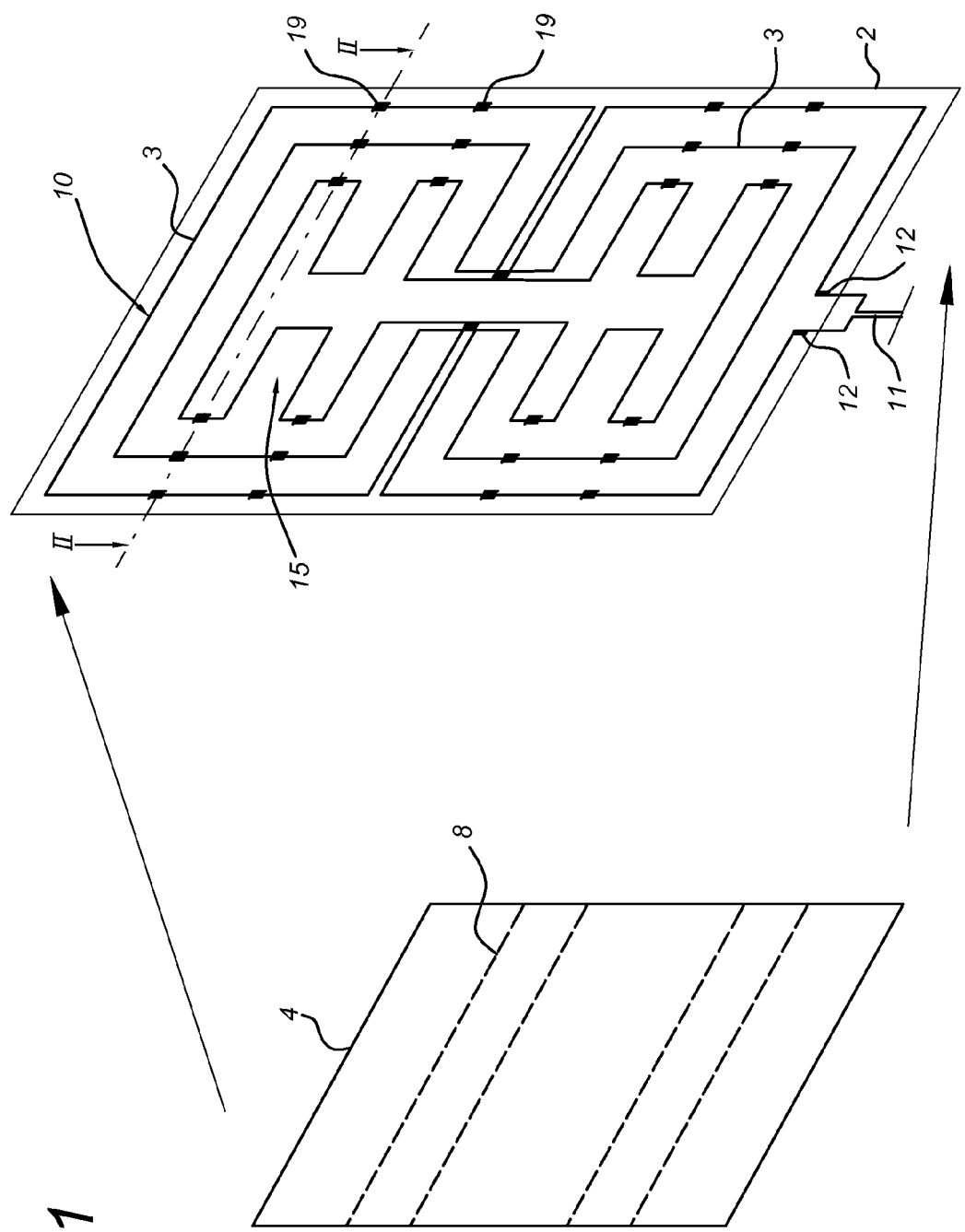
FIG. 1 shows a perspective view of a preferred embodiment of the invention of the flexible heating laminate in disassembled state.
Figure 4:
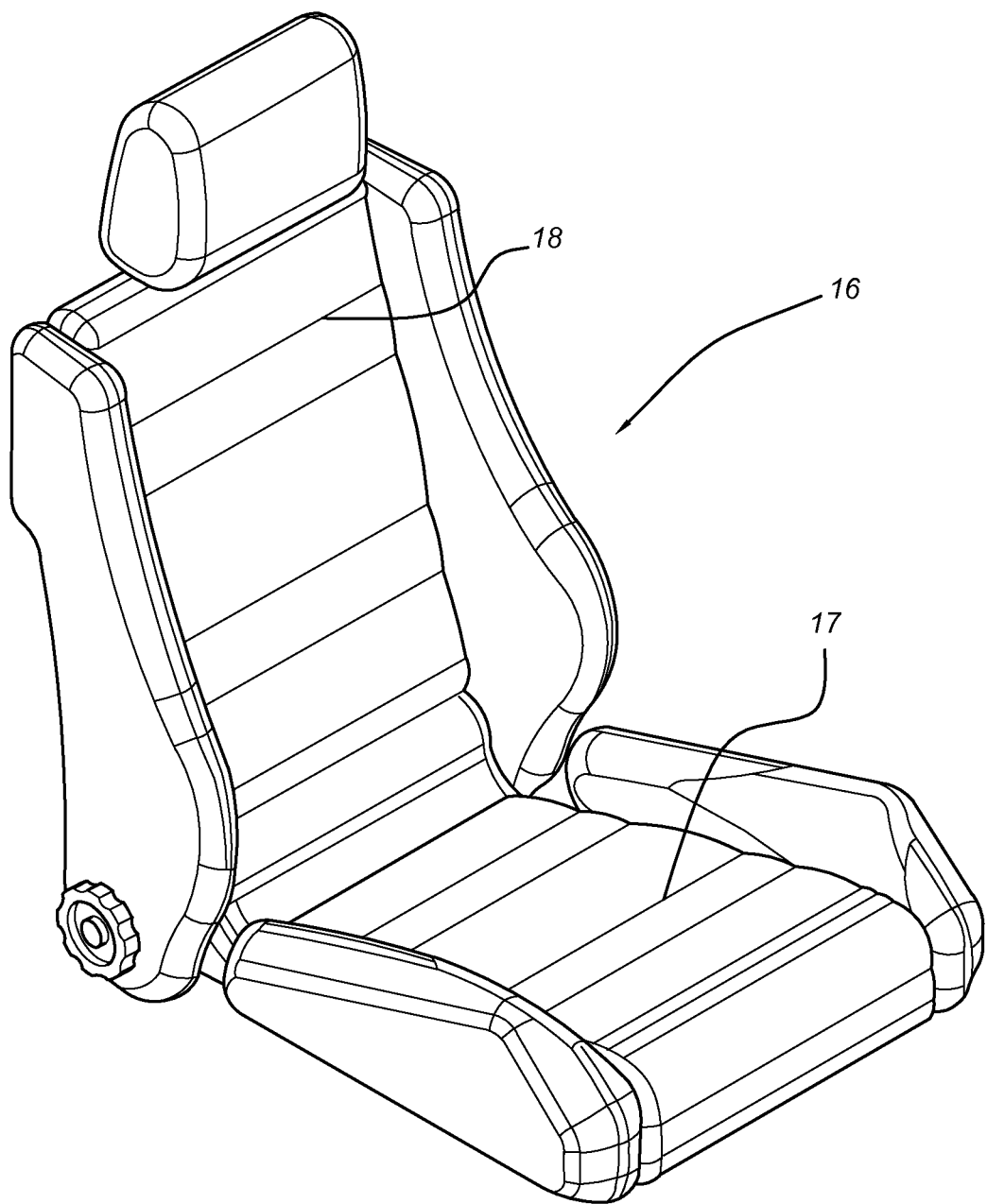
FIG. 4 shows a perspective view of a car seat with the flexible heating laminate according to the preferred embodiment of the invention.

FIG. 1 shows a flexible heating laminate in a disassembled state, wherein a top layer 4 and an electrically non-conductive substrate 2 are illustrated. The layer 4, hereafter referred as to the top layer, is to be stitched to the electrically non-conductive substrate 2 through a number of nominal stitching lines 8 parallel to each other. The flexible heating laminate 1 is to be accommodated or installed on a car seat 16, as can be seen in FIG. 4. The top layer 4, can be made of any suitable material for a specific application e.g. of natural or synthetic fabrics, natural or synthetic leather or a mixture of both.

As shown in FIG. 1, the substrate 2, which can be made of a material containing a thermoplastic polymer, such as polyethylene terephthalate (PET), comprises a printed electrical heating element 3 in a form of a circuit 10. The circuit 10 comprises a number of nominal punctured regions 19, being part of the circuit 10. The nominal punctured regions 16 are disposed at a distance from each other in symmetrical distribution. As it can be seen, the nominal stitching lines 8 will overlap the line on which the nominal punctured regions 16 are disposed, for stitching the substrate 2 and the top layer 4 together. The distribution of the nominal punctured regions 16, as illustrated, is regular, although this may also be irregular. For instance, the distribution of the nominal punctured regions 16 may be irregular, depending on the application of the flexible heating laminate 1.

It should be noted that the width of the connecting regions 6 as here represented is substantially larger than the rest of the electrical heating element 3. These connecting regions 6 as here illustrated are rectangular shaped, but could also have a different shape and magnitude, depending on the application and on other factors such as the distance between adjacent regions, the magnitude of the mechanical connection means, the thickness of the substrate 2 and the top layer 6.

The circuit 10 as here illustrated comprises a number of linearly distributed electrical heating elements 3 comprising a pair of nominal punctured regions 16 at a distance from each other, and two electrodes 12 printed onto the substrate 2 in the form of planar strips at the lower part of the circuit 10, and adjacent to the lower edge of the substrate 2. Moreover, the circuit 10 further comprises an electrical supply line 11 that is connected to a power source (not illustrated) so as to provide the required electrical current for heating up the car seat 16. A functional unit (not illustrated) such as seat occupancy sensor, a heat sensor or temperature sensor, an electrical sensor, etc. can be installed in the flexible heat laminate as to provide with valuable operational information.

As it can be appreciated, the electrical heating element 3 has a meandering shape or zigzag shape 15 in some of the areas of the circuit 10, so as to potentially supply more heat in those areas. Alternatively, this can serve to provide a uniform heat distribution.

Figure 2:
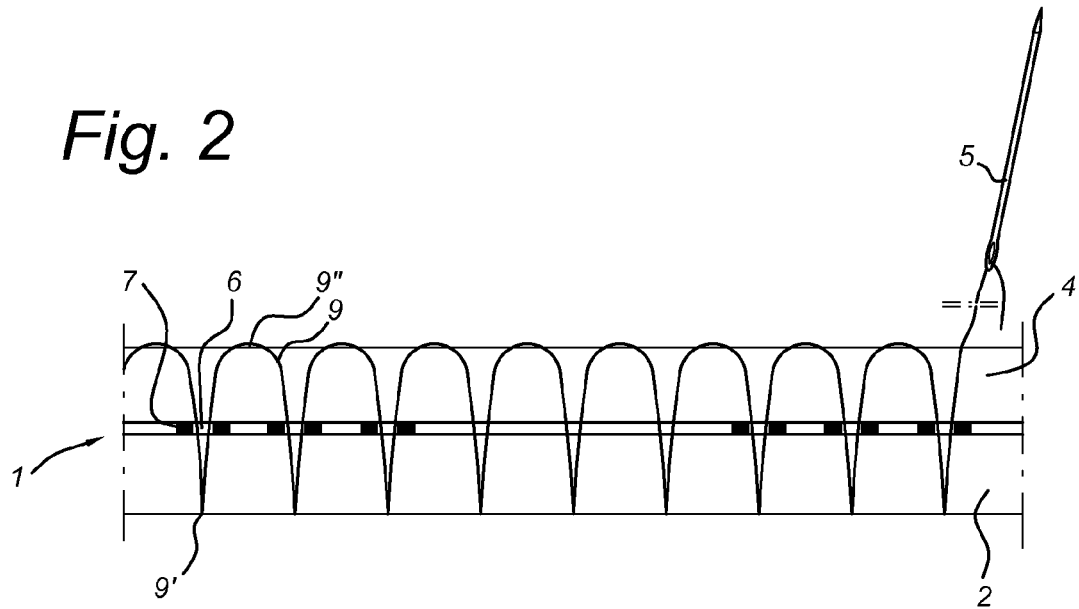
FIG. 2 shows a transverse cross section of the flexible heating laminate of FIG. 1 after assembled thereof along the line II-II.

In FIG. 2, a transverse cross section of the laminate 1 of FIG. 1 after assembled thereof along the line II-II is represented. The substrate 2 and the top layer 4 have been connected together by stitching those two elements at a punctured region 6, hereafter referred as connecting region, of the electrical heating element 3. A needle 5, first punctures the electrical heating element 3 at the connection region 6 of the electrical heating element 3. As it can be appreciated, the connection region 6 is contained between the non-punctured region 7 of the electrical heating element 3.

Moreover, the needle 5 and a thread approach the nominal puncture region 19 and puncture the electrical heating element 3 at the connection region 6, inserting a stitch 9 through the punctured region 6, of the electrical heating element 3, and extracting the stitch 9 from said connecting region 6, as to create a first connection point 9' at a lower point of the substrate 2, while a loop portion 9''' is created over part of the top layer 4 and a consecutive connection point 9' is established. The operation is repeated in a linear direction with respect to a longitudinal axis of the nominal stitching lines 8 of the top layer 4. In this manner, the substrate 2 and the top layer 4 are connected together. As illustrated, this operation is repeated several times, in such a way that the circuit 10 is always punctured at the connecting region 6 leaving a total thickness of the non-punctured region 7 of the electrical heating element 3 substantially equal along the entire circuit 10. In this way, the functionality of flexible heating element 3 is guaranteed, as no hotspot is created in the printed circuit 10 due to the puncture created in the electrical heating element 3.

Figure 3:
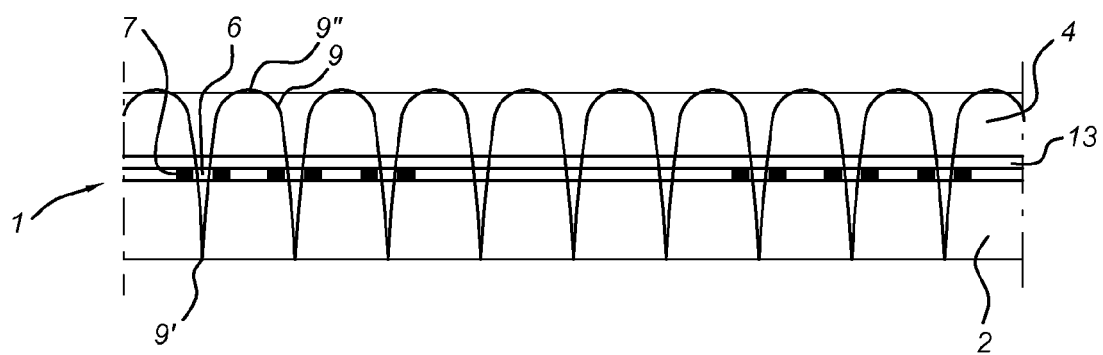
FIG. 3 shows a transverse cross section of the flexible heating laminate comprising a heat resistant layer according to a further embodiment of the invention.

FIG. 3 illustrates a transverse cross section of the laminate 1 of FIG. 1 along the line II-II wherein a heat-resistant adhesive cover 13 has been applied between the top layer 4 and the substrate 2. The heat-resistant adhesive cover 13 can be glued or welded onto the surface of the substrate 2 wherein the circuit 10 is printed. Otherwise, the heat-resistant adhesive cover 13 can be lay down onto said surface of the substrate 2 and connected to the substrate 2 and the top layer 4 when the stitching operation is performed.

The material forming the heat-resistant adhesive cover 13 can be the same material as the one conforming the substrate 2 or a different one, such as plastics materials like polyethylene (PE), polypropylene (PP), polycarbonate (PC) and polyethylene naphthalene (PEN). And this is merely a selection of the multitude of options currently available. Each material has its own unique characteristics and is thus either better or less well suited to a specific application. The material used comprises high flexibility as to allow optimal adaptation of the flexible heating laminate 1 to even or uneven surfaces. The thickness of said heat-resistant adhesive cover 13 is less than half of the total thickness of the flexible heating laminate 1.

It should be noted that the top layer 4 can be subject to abrasion or cuts from sharp objects that can penetrate and puncture the laminate in such a way that the circuit is damaged. When this occurs the electrical current cannot reach all the parts or lines of the circuit 10 due to a possible rupture or those parts or lines. Therefore, the heat-resistant adhesive cover 13 can be also applied onto the surface of the top layer 4 as to protect the top layer 4.

In FIG. 4 a car seat 16 according to a preferred embodiment of the invention is illustrated. The car seat 16 comprises a seat part 17 and a back part 18 wherein the flexible heating laminate 1 according to the invention is installed. As appreciated, the seat part 17 and the back part 18 comprise a number of lines, which correspond to the nominal stitching lines 8 as described above.

It should be noted that the flexible heating laminate according to the invention can be also be installed in other parts of the car, e.g. the floor carpet, the interior trim panel or other parts of the car seat such as the internal surfaces of the side parts of the car seat.

REFERENCE NUMERALS 1. flexible heating laminate
2. electrically non-conductive substrate
3. electrical heating element
4. layer
5. mechanical connection means
6. punctured region of the electrical heating element
7. non-punctured region of the electrical heating element
8. nominal stitching lines
9. a stitch or a sequence of stitches
9'. connection point
9". loop portion
10. circuit
11. electrical supply line or power line
12. electrode
13. heat-resistant cover layer
14. thermoplastic material
15. a meandering shape of the electrical heating element
16. car seat
17. seat part of the car seat
18. back part of the car seat
19. nominal puncture region

The invention claimed is:

1. A flexible laminate, comprising:
    an electrically non-conductive substrate with a substantially planar configuration,
    an electrically conductive element arranged on and along a surface of the electrically non-conductive substrate, and
    a layer arranged on and along a surface of the electrically nonconductive substrate,
    wherein the electrically conductive element is elongate and has an external cross-sectional contour delimiting a cross-sectional area of the electrically conductive element,
    wherein the electrically non-conductive substrate, the electrically conductive element and the layer are coaxially punctured along a puncture direction through the surface of the electrically non-conductive substrate, thereby forming a punctured region,
    wherein the electrically non-conductive substrate, the electrically conductive element and the layer are connected to each other through a mechanical connection means which extends substantially along the puncture direction through the electrically non-conductive substrate, the electrically conductive element and the layer at said punctured region,
    and wherein the cross-sectional area of the electrically conductive element at the location of the punctured region is larger than the cross-sectional area of the electrically conductive element outside the punctured region.

2. The flexible laminate according to claim 1, wherein, at the location of the punctured region, the magnitude of the cross-sectional area of the punctured region, as covered by the electrically conductive element material, is substantially equal to, preferably at least equal to, the magnitude of the cross-sectional area, as covered by the electrically conductive element material, of the electrically conductive element at the location outside the punctured region.

3. The flexible laminate according to claim 1, wherein the electrically conductive element has a thickness which is uniform over the punctured region as well as over a non-punctured region, and has a width at the punctured region which is larger than the width outside the punctured region.

4. The flexible laminate according to claim 1, wherein the electrically conductive element comprises a metal strip, preferably a copper strip, preferably a print, such as a copper print and/or a carbon print, said print being arranged on the electrically non-conductive substrate.

5. The flexible laminate according to claim 1, wherein the mechanical connection means comprises a stitch or a sequence of stitches.

6. The flexible laminate according to claim 1, wherein the electrically conductive element has the form of a circuit comprising at least one electrical supply line or power line, and/or at least two electrodes, e.g. configured as planar strips of an electrically conductive material, connected to the electrically conductive element.

7. The flexible laminate according to claim 1, wherein the electrically conductive element comprises several punctured regions at a distance from each other.

8. The flexible laminate according to claim 1, wherein the electrically nonconductive substrate comprises a thermoplastic material which preferably comprises Polyethylene terephthalate (PET).

9. The flexible laminate according to claim 1, wherein the electrically conductive element has a meandering shape or zigzag shape, a series of stitches crossing said meanderingly shaped electrically conductive element and said electrically conductive element being punctured at the regions thereof which cross the series of stitches.

10. The flexible laminate according to claim 1, wherein the electrically conductive element comprises an electric resistance heater.

11. The flexible laminate according to claim 1, wherein the electrically conductive element comprises electric feed lines for supplying electric current.

12. The flexible laminate according to claim 1, wherein the electrically nonconductive substrate, the electrically conductive element and the layer have a non-punctured location outside the punctured region and the cross-sectional area of the electrically conductive element at the location of the punctured region is larger than the cross-sectional area of the electrically conductive element at said non-punctured location outside the punctured region.

13. A car seat comprising a seat part and a back part, and a flexible laminate according to claim 1, said flexible laminate being accommodated in the seat part and/or the back part.

14. An electrically conductive device for use in the flexible laminate according to claim 1, comprising an electrically non-conductive substrate and an elongate electrically conductive element, said electrically conductive element comprising at least one nominal puncture region or region to be punctured, wherein at said at least one nominal puncture region the magnitude of the cross-sectional area as covered by the electrically conductive element material is larger than the magnitude of the cross-sectional area of the electrically conductive element material at a neighboring region.

15. The electrically conductive device according to claim 14, wherein the length of the nominal puncture region is of the same order of magnitude as the width and/or height thereof.

16. A method for manufacturing a flexible laminate, comprising:
   a) providing an electrically non-conductive substrate of flexible material;
   b) applying onto and along one surface of the electrically nonconductive substrate an elongate electrically conductive element that has an external cross-sectional contour delimiting a cross-sectional area of the electrically conductive element,
   c) providing a layer onto and along one of the surfaces of the electrically non-conductive substrate,
   d) coaxially puncturing the electrically nonconductive substrate, the electrically conductive element, and the layer along a puncture direction through the surface, so as to form a punctured region, wherein the cross-sectional area of the electrically conductive element at the location of the punctured region is larger than the cross-sectional area of the electrically conductive element outside the punctured region, and
   e) providing a mechanical connection means that extends at the punctured region substantially along the puncture direction through the electrically non-conductive substrate, the electrically conductive element, and the layer.

17. The method according to claim 16, comprising:
at the location of the punctured region, letting the magnitude of the cross-sectional area of the punctured region, as covered by the electrically conductive element material, be at least substantially equal to the magnitude of the cross-sectional area, as covered by the electrically conductive element material, of the electrically conductive element at the location outside the punctured region.

18. The method according to claim 16, comprising:
providing the electrically conductive element with a thickness that is uniform over the punctured region as well as over the non-punctured region, and with a width at the punctured region which is larger than the width outside the punctured region.

19. The method according to claim 16, comprising:
providing the electrically conductive element with a metal print that is arranged on the substrate.

20. The method according to claim 16, comprising:
forming the electrically conductive element as a circuit, which comprises at least one electrical supply line or power line and/or at least two electrodes connected to the electrically conductive element.

* * * * *